(12) United States Patent
Richieri

(10) Patent No.: US 7,955,961 B2
(45) Date of Patent: Jun. 7, 2011

(54) PROCESS FOR MANUFACTURE OF TRENCH SCHOTTKY

(75) Inventor: Giovanni Richieri, Turin (IT)

(73) Assignee: International Rectifier Corporation, El Segundo, CA (US)

(*) Notice: Subject to any disclaimer, the term of this patent is extended or adjusted under 35 U.S.C. 154(b) by 301 days.

(21) Appl. No.: 11/715,225

(22) Filed: Mar. 7, 2007

(65) Prior Publication Data

US 2007/0264809 A1 Nov. 15, 2007

Related U.S. Application Data

(60) Provisional application No. 60/779,829, filed on Mar. 7, 2006.

(51) Int. Cl.
*H01L 27/095* (2006.01)
*H01L 29/47* (2006.01)
*H01L 21/338* (2006.01)

(52) U.S. Cl. .. 438/580; 438/582; 257/471; 257/E21.002

(58) Field of Classification Search ................. 438/580, 438/582; 257/471, 484, 485, 449, 452, 466, 257/E21.001, E21.002
See application file for complete search history.

(56) References Cited

U.S. PATENT DOCUMENTS

| | | | | |
|---|---|---|---|---|
| 4,139,442 A * | 2/1979 | Bondur et al. | ............... | 438/425 |
| 4,211,582 A * | 7/1980 | Horng et al. | ................. | 438/426 |
| 4,752,813 A * | 6/1988 | Bhatia et al. | ................ | 257/479 |
| 5,539,240 A * | 7/1996 | Cronin et al. | ................ | 257/520 |
| 5,627,427 A * | 5/1997 | Das et al. | ..................... | 313/308 |
| 2004/0007723 A1* | 1/2004 | Andoh et al. | ................ | 257/284 |
| 2004/0129976 A1* | 7/2004 | Haynie et al. | ................ | 257/347 |
| 2005/0012175 A1* | 1/2005 | Tsuruta | ........................ | 257/531 |
| 2005/0230744 A1* | 10/2005 | Wu | .............................. | 257/330 |
| 2006/0231915 A1* | 10/2006 | Hshieh et al. | ................ | 257/491 |

* cited by examiner

*Primary Examiner* — Matthew S Smith
*Assistant Examiner* — Michelle Fan
(74) *Attorney, Agent, or Firm* — Farjami & Farjami LLP

(57) ABSTRACT

A trench-type Schottky semiconductor device and a method for fabricating the trench-type Schottky semiconductor device are disclosed. The method includes the steps of forming an epitaxial (EPI) layer atop a silicon substrate, forming a nitride layer atop the EPI layer, patterning a plurality of windows in the nitride layer into an active region and a termination region, forming a plurality of trenches in the active and termination regions such that the plurality of trenches in the termination regions are spaced apart from each other so as to form a plurality of mesas, lining the first type of trenches with a gate oxide layer, and converting the mesas to oxide mesas; and then applying a barrier layer metal to the mesas in the device active area and in the termination trenches.

19 Claims, 7 Drawing Sheets

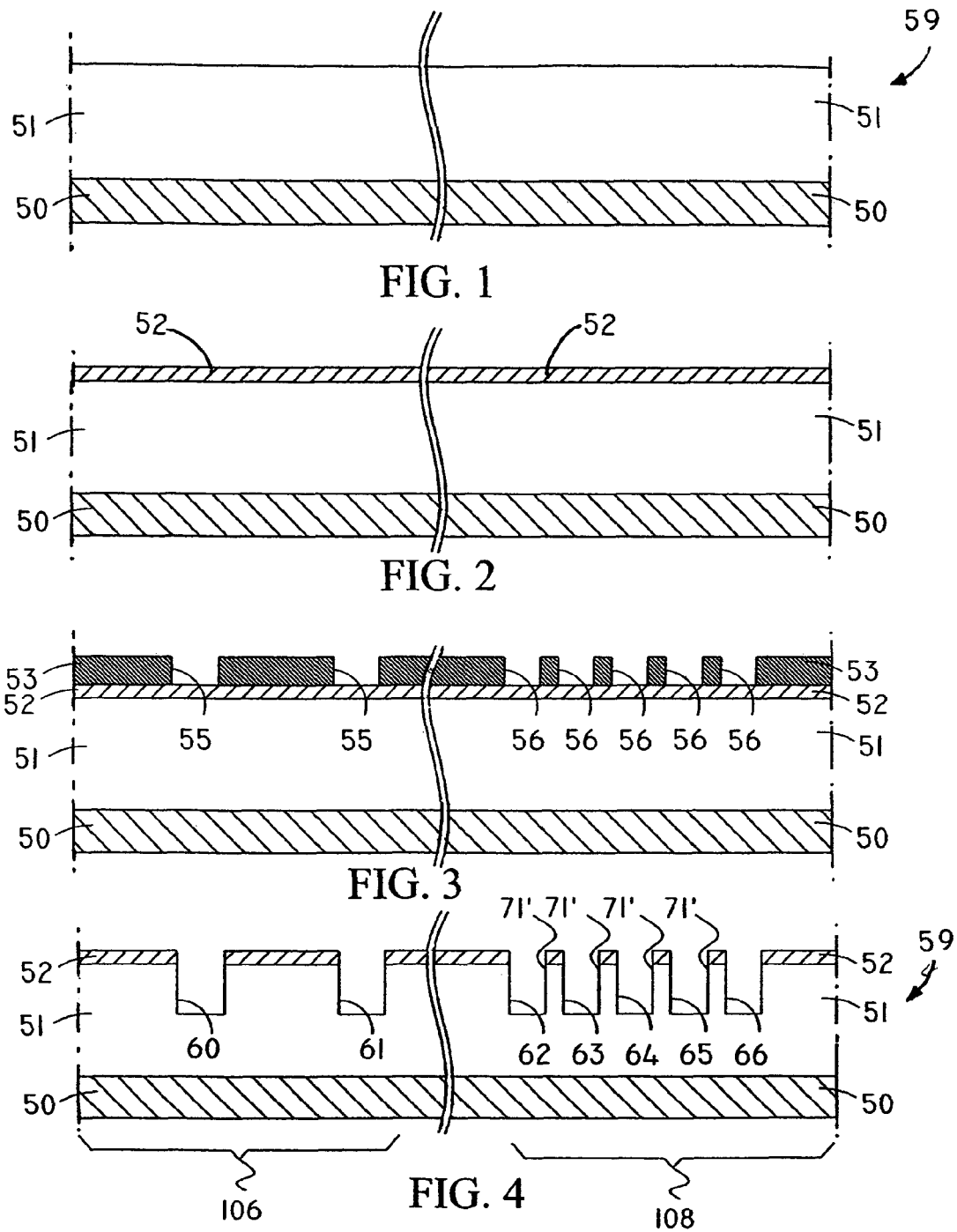

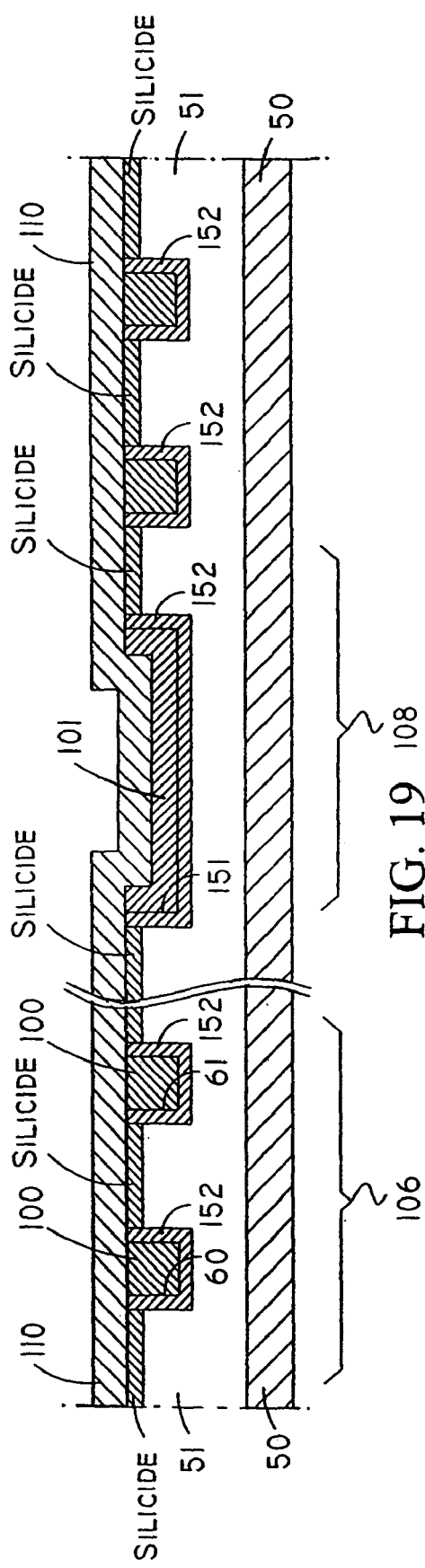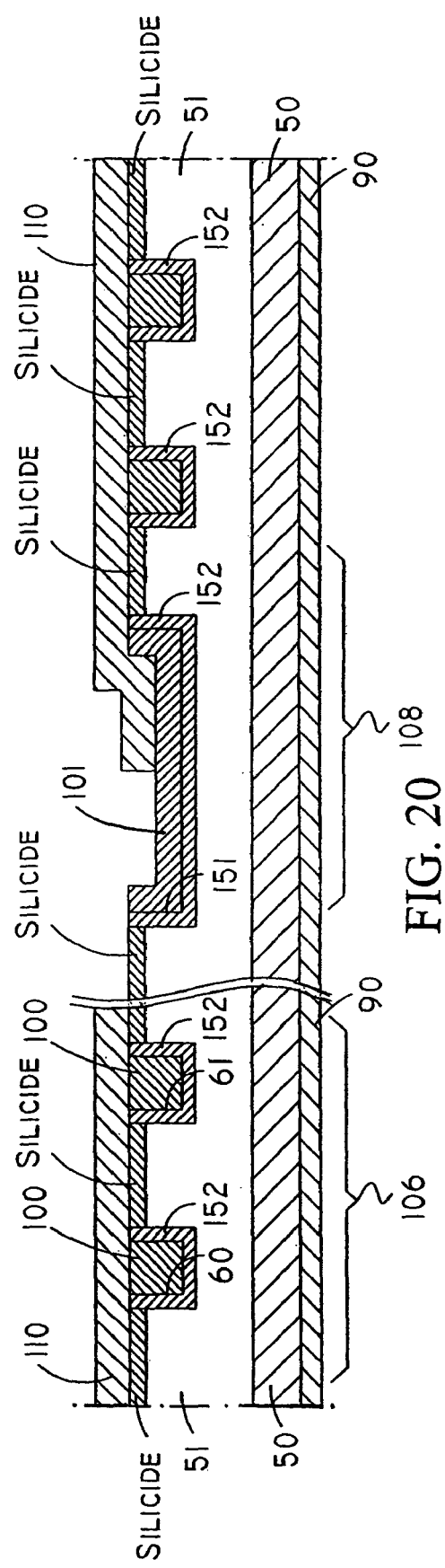

PROCESS FOR MANUFACTURE OF TRENCH SCHOTTKY

CROSS-REFERENCE TO RELATED APPLICATION

This application is based on and claims priority to U.S. Provisional Patent Application Ser. No. 60/779,829, filed on Mar. 7, 2006 and entitled PROCESS FOR MANUFACTURE OF TRENCH SCHOTTKY (GEN 5), the entire contents of which are incorporated by reference herein.

FIELD OF THE INVENTION

This invention relates to semiconductor devices, and more particularly to a trench-type Schottky device and a novel mask process for the manufacture thereof.

BACKGROUND OF THE INVENTION

Trench-type Schottky devices are well-known and are used for many electronic devices. Trench-type Schottky devices are valued for, among other things, their fast recovery time. Typically, the manufacture of trench-type Schottky devices is complicated, as it requires a large number of mask layers and manufacturing steps. Because of this complexity, Trench-type-Schottky manufacture may result in less than desirable yields. Accordingly, it is desirable to simplify the manufacturing process of such devices as much as possible without jeopardizing product quality.

BRIEF SUMMARY OF THE INVENTION

In accordance with the present invention, trench-type Schottky devices are formed using a two- or three-mask process and oxide spacers are formed in the termination region of such devices. Additionally, novel processes for planarizing these devices during manufacture, which include the use of polyoxide or plasma planarization, are disclosed.

Accordingly, it is an aspect of the present invention to provide a method for fabricating trench-type Schottky semiconductor devices. The method includes the steps of forming an epitaxial (EPI) layer atop a silicon substrate, forming a nitride layer atop the EPI layer, patterning a plurality of windows in the nitride layer, forming a plurality of trenches in an active region and a termination region, at least some trenches being spaced apart from each other so as to form a plurality of mesas in the termination region, lining the trenches with an oxide layer, and converting the plurality of mesas to oxide mesas.

In accordance with further aspects of the present invention, the method for forming trench-type Schottky semiconductor devices includes filling the plurality of trenches with a barrier metal, and forming a buffer atop the barrier metal. The oxide mesas are located in the termination region and the buffer may include one of TiN or TiW and the barrier metal may include Pd or Mo.

The method may further include forming a contact metal (e.g., Al) on an exposed surface of the buffer layer and forming a back metal on an exposed portion of the silicon substrate. The method may also include separating at least parts of the active region and termination region from each other. The method may also include forming (e.g., by deposition, etc.) a backmetal on a lower surface of the silicon substrate.

According to yet another aspect of the present invention, there is provided a method for forming trench-type Schottky semiconductor devices using a method which includes the steps of filling the trenches with a conductive polysilicon and doping the polysilicon to a P type. The method can further include converting at least part of the polysilicon to oxide and thereafter removing the nitride layer. The method may further include forming a layer comprising a barrier metal, a buffer, and a contact metal atop a silicide layer, separating at least parts of the active and termination regions and applying a back metal to a lower surface of the silicon substrate.

According to a further aspect of the present application, there is provided a trench-type Schottky device which includes a substrate having upper and lower surfaces, an epitaxial layer adjacent to the upper surface of the substrate, and a plurality of trenches. In the trench-type Schottky device, at least two of the plurality of trenches define a gate area in an active region, and a plurality of other trenches define oxide mesas in an inactive region. An oxide layer is located in each of the plurality of trenches, a barrier metal layer is located adjacent to an upper surface of the epitaxial layer, a buffer layer is located on an upper surface of the barrier metal layer, a contact metal layer is located adjacent to an upper surface of the buffer layer, and a backmetal layer is located adjacent to the lower surface of the substrate. Moreover, a trench is formed in the contact metal layer and the barrier metal layer. This trench has side and bottom walls, wherein the bottom walls are defined by an upper surface of the epitaxial layer, upper walls of a plurality of the oxide mesas, and parts of the barrier metal which fills in the plurality of trenches.

According to yet another aspect of the present invention, there is provided a method for fabricating a trench-type Schottky semiconductor device. The method includes the steps of forming one or more semiconductor mesas to define one or more termination trenches, lining the one or more termination trenches with an oxide layer, and filling at least parts of the one or more termination trenches with a conductive polysilicon. The method may further include doping the polysilicon to a P type, planarizing the conductive polysilicon, and converting at least part of the polysilicon to an oxide. The method may further include forming a layer comprising a barrier metal, a buffer, and a contact metal atop a silicide layer in contact with at least part of the oxide, and etching at least parts of each of the barrier metal, the buffer, and the contact metal so as to separate at least parts of the active region and the termination region from each other. The method may also include oxidizing at least parts of the one or more semiconductor mesas to obtain a plurality of fully oxidized mesas spaced apart from each other by at least one mesa of the one or more semiconductor mesas.

BRIEF DESCRIPTION OF THE DRAWINGS

The above and other objects, features and advantages of the present invention will become more apparent from the following detailed description when taken in conjunction with the accompanying drawings, in which:

FIGS. 1-7 illustrate a process of forming a trench-type Schottky semiconductor device according to a first embodiment of the present invention;

FIGS. 13-20 illustrate a process for forming a trench-type Schottky semiconductor device according to a third embodiment of the present invention.

DETAILED DESCRIPTION OF EMBODIMENTS OF THE INVENTION

Figure 5:
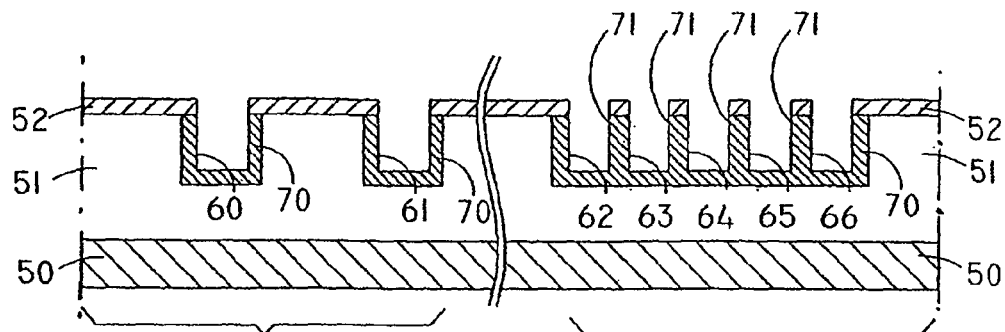

The following detailed description of the preferred embodiments of the present invention will be made with reference to the accompanying drawings. In describing the invention, explanations about related functions or constructions which are known in the art will be omitted for the sake of clarity in understanding the concept of the invention.

For the sake of clarity, in each of the following cross-sectional figures, a portion of a device active region of the trench-type Schottky will be shown on a left side of a drawing, and to the right, a portion of a related termination region will be shown.

A process for forming a trench-type Schottky device (hereinafter trench-type Schottky) according to a first embodiment of the present invention will now be described with reference to FIGS. 1-7.

In FIGS. 1-7, a novel two-mask process in which silicon rings formed by grooves are converted fully to silicon dioxide, which oxide rings are subsequently filled with a barrier metal (e.g., see, FIGS. 5 and 6) according to the present invention, is shown.

With reference to FIG. 1, in a first step, an epitaxially-deposited silicon (EPI) layer 51 is grown atop a high concentration N-type silicon substrate 50 of silicon wafer 59.

With reference to FIG. 2, a nitride layer 52 is then grown atop the EPI layer 51. In the preferred embodiment, the nitride layer 52 is deposited atop the EPI layer 51 using conventional deposition means and has a thickness of about 1000 Å.

With reference to FIG. 3, a first mask step includes forming (or otherwise placing, patterning, depositing, etc.) a photo-resist layer 53 atop the nitride layer 52 and then forming groove-defining windows 55 and 56 in the active and termination regions 106 and 108, respectively, in the photo-resist layer 53. The photo-resist layer 53 can be formed using well-known methods and can be, for example, photolithographically processed to form the groove-defining windows 55 and 56. In the preferred embodiment, the groove-defining windows 55 in the active region 106 have a width of about 0.4-0.6 μm, and the groove-defining windows 56 in the termination region 108 have a width of about 0.6 μm. In the termination region 108, the groove-defining widows 56 are spaced apart from each other by a distance m of about 0.6 μm.

Thereafter, known methods are used to remove exposed parts of the nitride layer 52 and the EPI layer 51 so as to form trenches 60 which may be, for example, 0.4 to 0.6 μm wide and have any necessary depth. Trenches 60 in the active area 106 define any desired mesa width, and trenches 62, 63, 64, 65, and 66 in the termination region 108 preferably have a width of about 0.6 μm, and define mesas 71' which are about 0.6 μm wide. For example, with reference to FIG. 4, trenches, such as trenches 60, 61, 62, 63, 64, 65, and 66, can be simultaneously etched using a plasma trench etch with hard mask. After forming the mesas 60, 61, 62, 63, 64, 65, and 66, the photo-resist layer 53 is stripped away and the resulting wafer 59 is cleaned.

As next shown in FIG. 5, a gate oxidation step is used to form a gate oxide layer 70, which may be about 5000 Å thick on the walls of trenches 60 and 61, and to simultaneously convert the mesas 71' between trenches 62 and 66 completely to oxide mesas 71.

Figure 6:
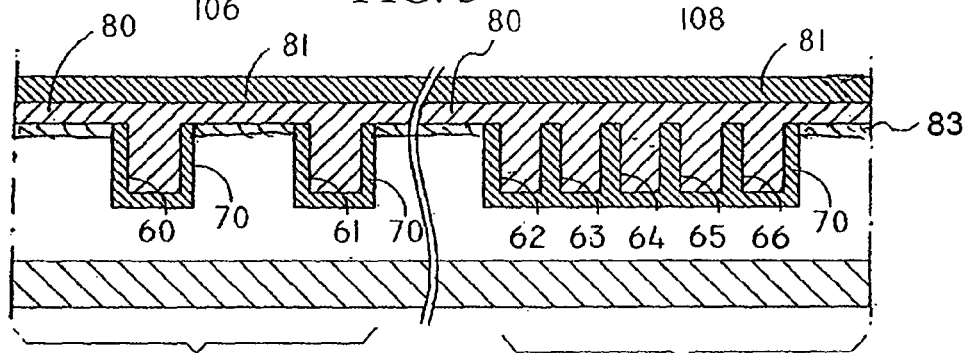

Thereafter, and as shown in FIG. 6, a nitride wet etch is used to remove the nitride layer 52, and, following a clean, a buffer layer 83 of TiN or TiW is deposited atop the exposed silicon mesas. A barrier metal 80, such as, for example, Pd or Mo, is next deposited into the trenches 61-66 and atop the oxide mesas 71. A contact metal 81, such as Al, is then deposited atop the barrier layer 80.

Figure 7:
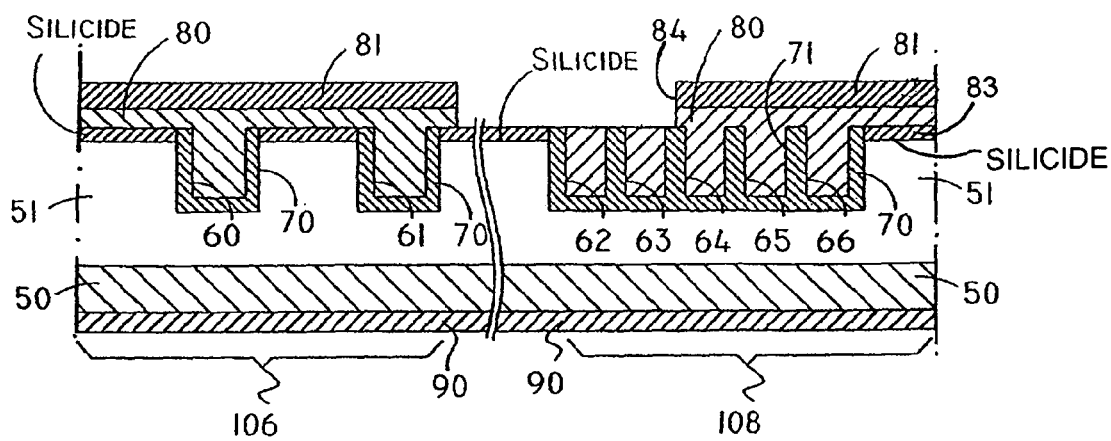

A second mask step is then carried out, as shown in FIG. 7, which is a metal etch mask step, and parts of the barrier metal 80, the contact metal 81, and the buffer layer 83 are etched, so as to form a trench 84 which separates the active area region 106 from the termination region 108. A back metal 90 (e.g., a cathode) is formed on a lower surface of the N-type silicon substrate 50 as is shown in FIG. 7.

A second embodiment of the present invention will now be discussed with reference to FIGS. 8-12. In the second embodiment of the present invention, a novel polyoxide planarization is carried out as shown in FIGS. 8 to 12 where conductive polysilicon fills the trenches 60-66 instead of the barrier metal 80 as shown in FIGS. 6 and 7.

Figure 8:
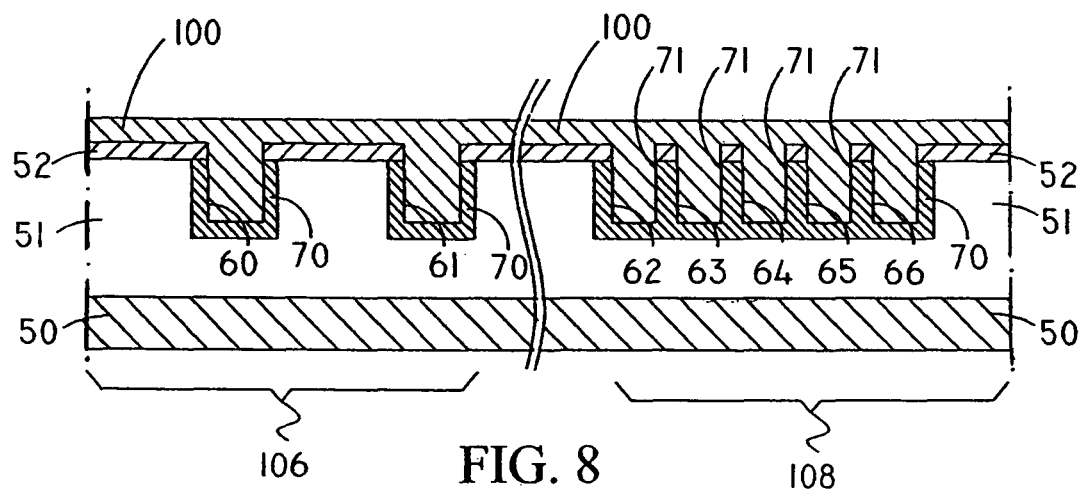
FIGS. 8-12 illustrate a process for forming a trench-type Schottky semiconductor device according to a second embodiment of the present invention.

Thus, in the second embodiment, the process steps of FIGS. 1-5 are first carried out. However, instead of depositing barrier metal 80 as is shown in FIGS. 6-7 and described in the corresponding text, polysilicon 100, doped or undoped, is deposited in the trenches 60-66 and atop the mesas 71 as shown in FIG. 8. The polysilicon 100 is preferably deposited at 620° C. and may be subsequently doped to a P type if not doped during deposition.

Figure 9:
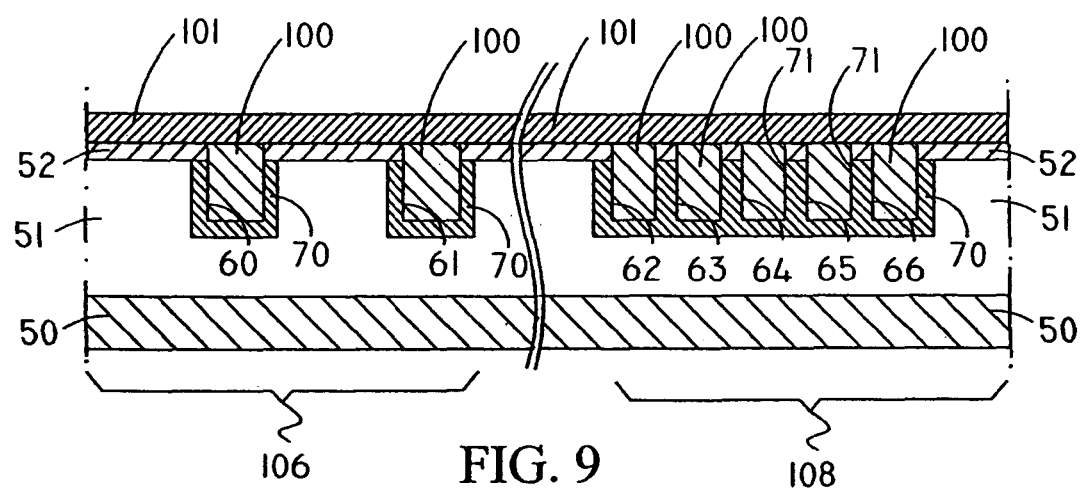

Thereafter, and as shown in FIG. 9, the polysilicon 100 atop the mesas 71 is converted to an oxide to convert the polysilicon 100 atop the nitride layer 52 to an oxide layer 101. Thereafter, the oxide layer 101 is removed, by using, for example, a wet etch (BOE), such as a nitride wet etch, for poly-planarization.

Figure 10:
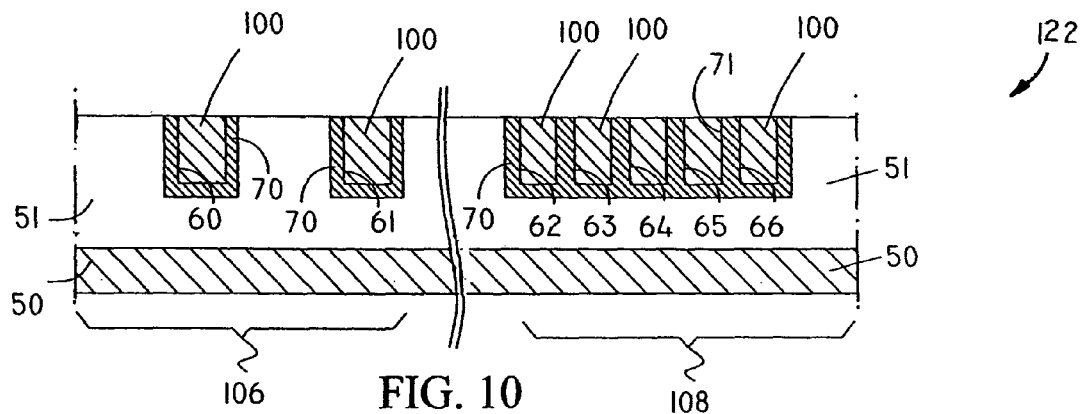
Figure 11:
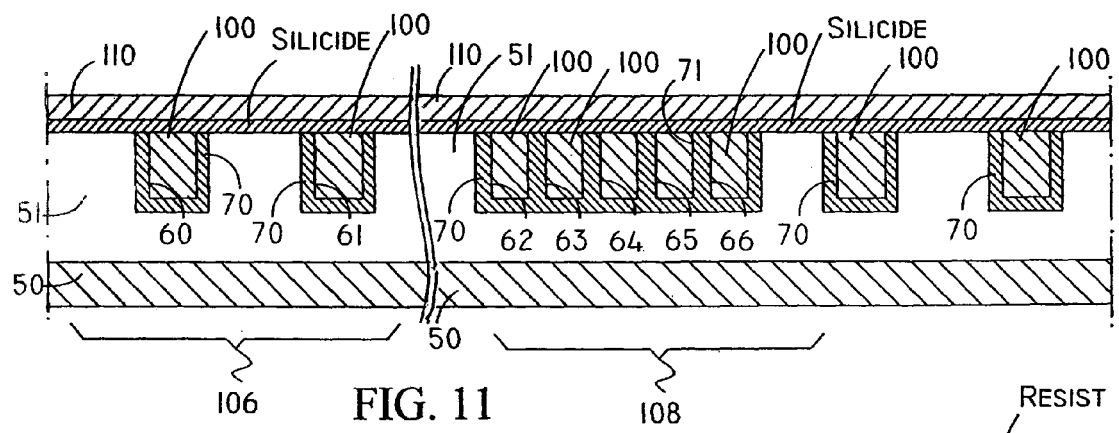
Figure 12:
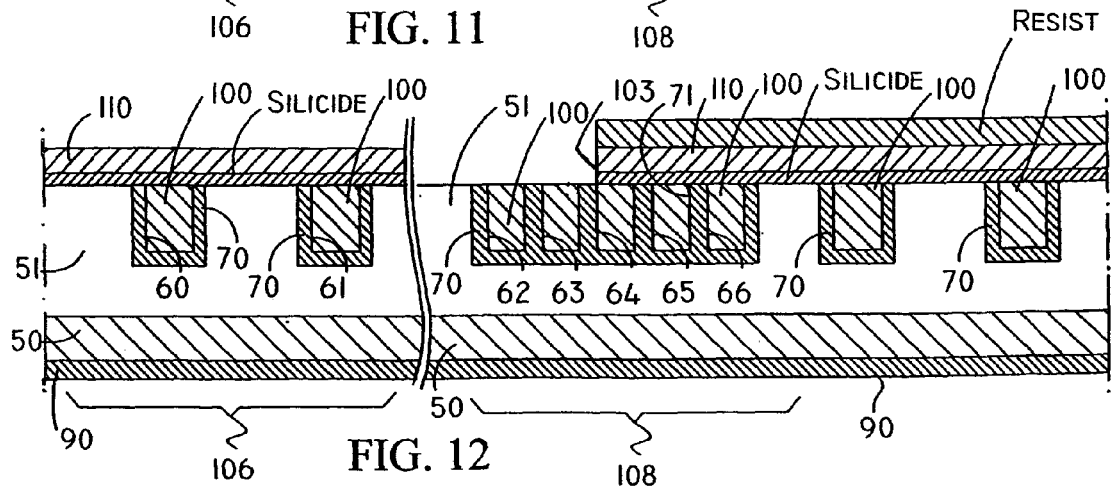

As next shown in FIG. 10, the nitride layer 52 is removed with a suitable etch such as a nitride wet etch. Wafer 122 is then cleaned and the metallizing process of FIG. 6 is carried out as shown in FIG. 12. That is, a barrier metal, such as Pd—Mo, is deposited followed by a TiN buffer and Al contact metal, shown jointly as metal layer 110 in FIGS. 11 and 12. The wafer is then subject to a rapid thermal anneal (RTA) to form the sinter.

Thereafter, a second mask step is carried out (e.g., see, FIG. 12) to form trench 103 and separate the active region 106 from the termination region 108. A back metal 90 is applied to the N-type silicon substrate 50.

It should be noted, that in the process sequence of FIGS. 8-12, the polyoxide planarization is carried out at FIG. 9. However, if desired, this step can be carried out by, for example, using plasma planarization.

Figure 13:
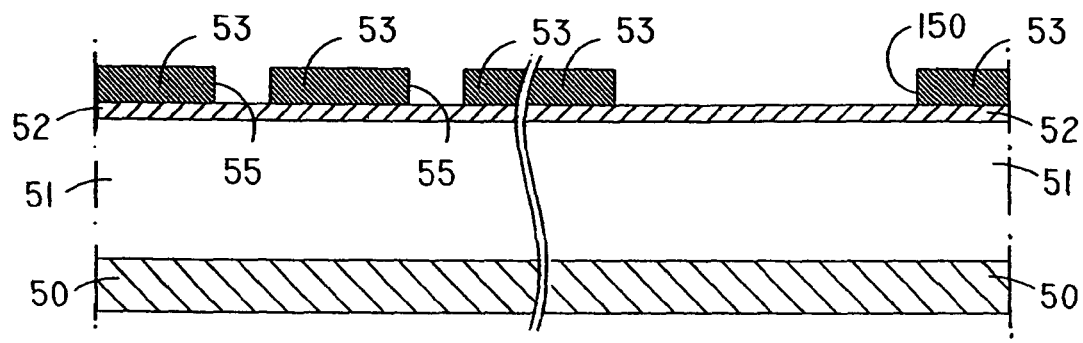

A third embodiment of the present invention will now be described with reference to FIGS. 13-20. In the third embodiment of the present invention, a three-mask process is used to form the trench-type Schottky device with a modified termination. Thus, the process starts as described above with respect to FIGS. 1-2; however, the mask for a first mask step as shown in FIG. 13, and which corresponds with the first mask step of FIG. 3, has a window 150 which is wider than any of the windows 56 shown in FIG. 1.

Figure 14:
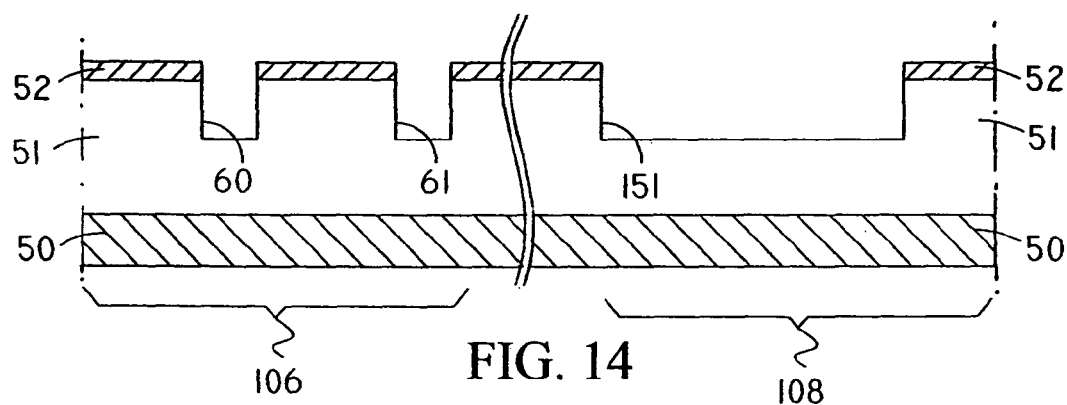
Figure 15:
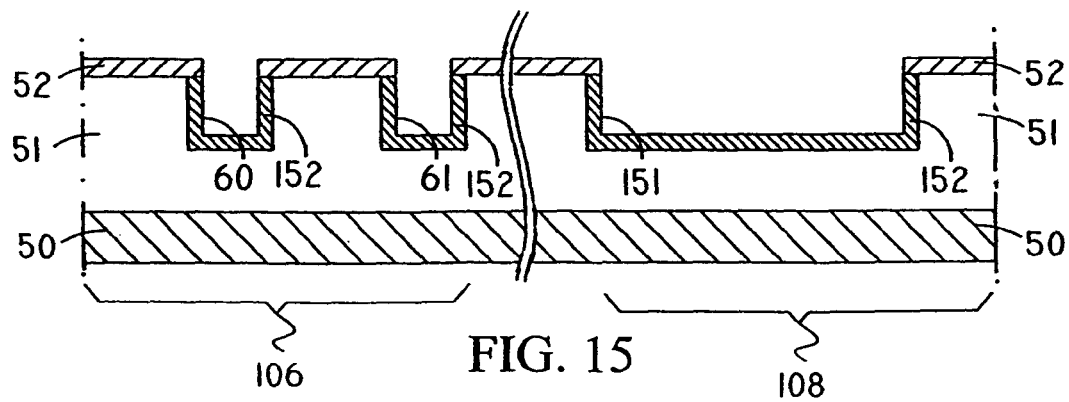

Then, as shown in FIG. 14, a plasma etch is used to simultaneously remove parts of the nitride layer 52 and the EPI layer 51 and form trenches 60 and 61 in the active region 106, and a single wide trench 151 in the termination region 108. A gate oxidation is then performed, and an oxide 152 which is preferably about 4,000 to 5,000 Å thick is formed in each of the trenches 60, 61, and 151, as shown in FIG. 15.

Figure 16:
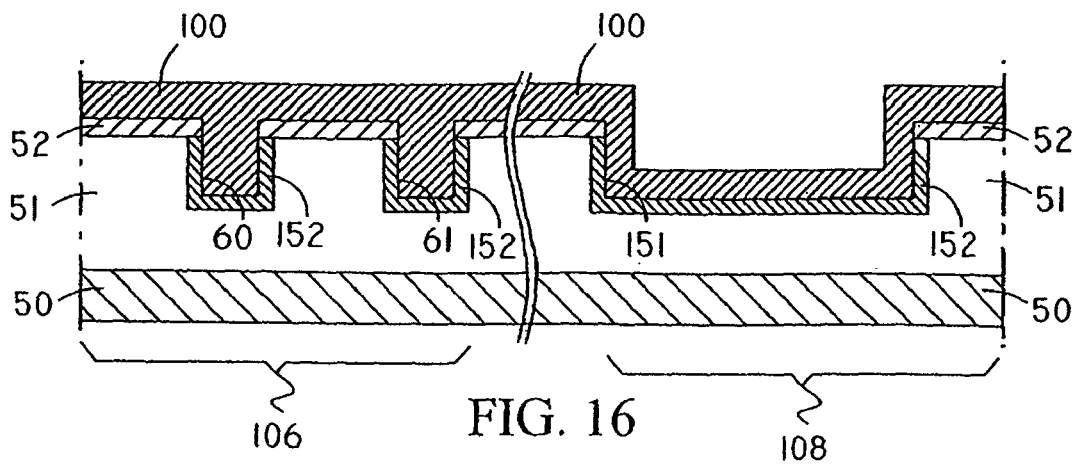

With reference to FIG. 16, polysilicon 100 (e.g., see FIG. 8), doped or undoped, is formed in the trenches 60-61 and 151, as shown. As shown, the polysilicon 100 fully fills the trenches 60 and 61 and partially fills the trench 151. The polysilicon 100 is preferably deposited at 620° C. and may be subsequently doped to a P type if not doped during deposition, and is then planarized, as shown.

Figure 17:
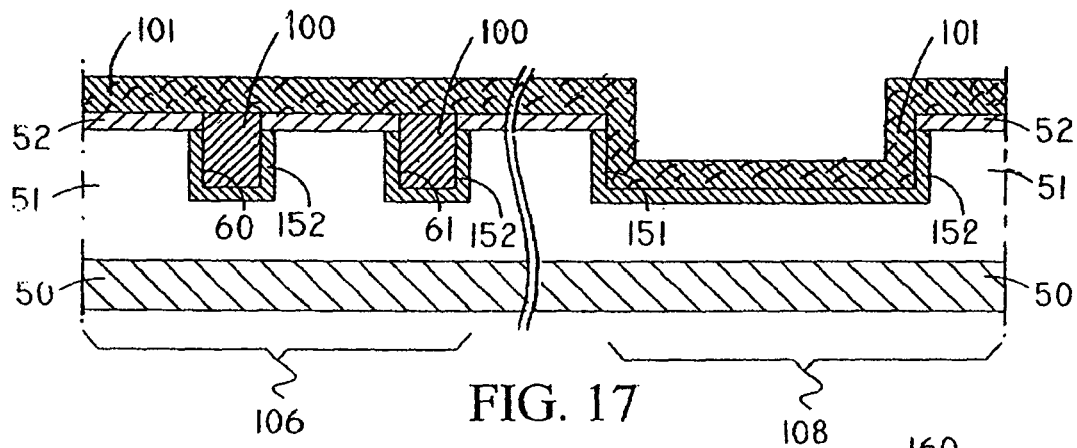

Then, with respect to FIG. 17, the upper surface of the polysilicon 100 is converted to oxide layer 101, as shown.

Figure 18:
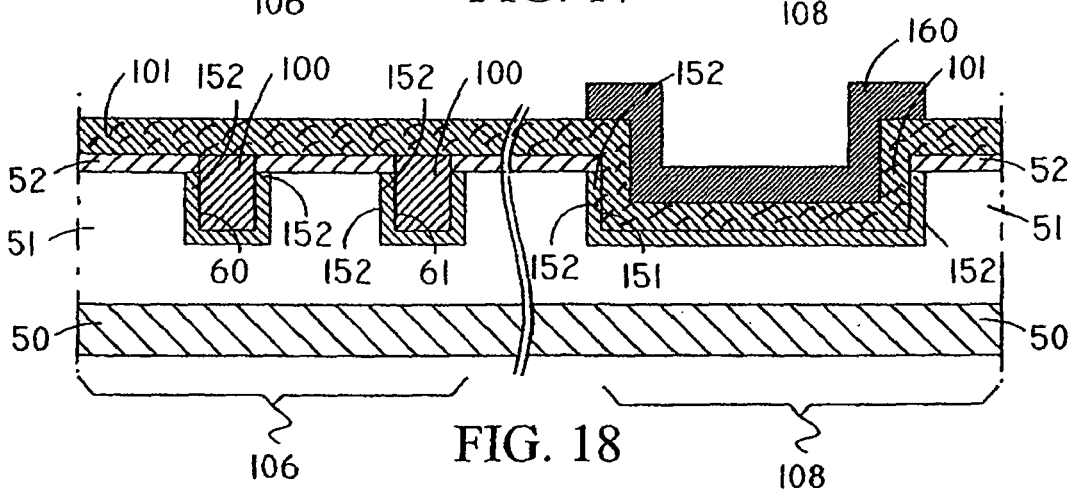

Thereafter, with respect to FIG. 18, in a second mask step, a photoresist layer 160 is applied in trench 151 as shown.

Thereafter, parts of the exposed oxide layer 101 are removed using, for example, a BOE etch. The photoresist layer 160 is then stripped and a nitride wet etch is performed. A defreckle step may be performed if desired.

The wafer is then cleaned and the metallizing process of FIG. 6 is carried out as shown in FIG. 19. That is, a barrier metal, such as Pd or Mo, is deposited, followed by a TiN buffer and Al contact metal, shown jointly as metal layer 110. After application, the metal layer 110 may be sintered if desired.

With reference to FIG. 20, in a third mask step, the metal layer 110 is etched and separated from itself so as separate the active region 106 and termination region 108 from each other. A back metal 90 is applied to the N-type silicon substrate 50, as shown.

Although the present invention has been described in relation to particular embodiments thereof, many other variations and modifications and other uses will become apparent to those skilled in the art. It is preferred, therefore, that the present invention not be limited by the specific disclosure herein.

What is claimed is:

1. A method, comprising the steps of:
    forming a plurality of spaced semiconductor mesas to define a plurality of spaced termination trenches;
    lining the plurality of spaced termination trenches with an oxide layer;
    oxidizing the plurality of mesas to obtain a plurality of fully oxidized mesas; and
    filling the plurality of spaced termination trenches with a barrier metal to form a trench-type Schottky semiconductor device.
2. The method of claim 1, further comprising placing a buffer atop the metal barrier.
3. The method of claim 2, wherein the buffer comprises TiN or TiW, and the barrier metal comprises Pd—Mo.
4. The method of claim 2, further comprising:
    forming a contact metal comprising Al on an exposed surface of the buffer.
5. The method of claim 4, further comprising etching at least parts of the barrier metal so as to separate at least parts of active and termination regions from each other.
6. The method of claim 4, wherein each of the plurality of spaced termination trenches has side and bottom walls.
7. The method of claim 1, further comprising filling the plurality of spaced termination trenches with a conductive polysilicon.
8. The method of claim 7, further comprising doping the polysilicon to a P type.
9. The method of claim 7, further comprising converting at least part of the polysilicon to oxide.
10. The method of claim 9, further comprising placing a layer comprising a barrier metal, a buffer, and a contact metal atop a silicide layer in contact with at least part of the oxide.
11. The method of claim 10, further comprising:
    etching at least parts of each of the barrier metal, the buffer, and the contact metal so as to separate at least parts of the active and termination regions from each other.
12. The method of claim 1, wherein the plurality of spaced termination trenches surrounds an active region.
13. A method, comprising the steps of:
    forming one or more semiconductor mesas to define one or more termination trenches;
    lining the one or more termination trenches with an oxide layer;
    oxidizing the one or more semiconductor mesas to obtain a plurality of fully oxidized mesas; and
    filling at least parts of one or more termination trenches with a doped conductive polysilicon to form a trench-type Schottky semiconductor device.
14. The method of claim 13, further comprising filling the plurality of spaced termination trenches with a barrier metal.
15. The method of claim 14, further comprising placing a buffer atop the metal barrier.
16. The method of claim 14, further comprising forming a contact metal comprising Al on an exposed surface of the buffer.
17. A method comprising:
    forming one or more semiconductor mesas to define one or more termination trenches;
    lining the one or more termination trenches with an oxide layer;
    oxidizing the one or more semiconductor mesas to obtain a plurality of fully oxidized mesas;
    filling at least parts of one or more termination trenches with an undoped conductive polysilicon layer; and
    subsequently doping said undoped conductive polysilicon layer to a P type doped conductive polysilicon to form a trench-type Schottky semiconductor device.
18. The method of claim 17, further comprising filling the plurality of spaced termination trenches with a barrier metal.
19. The method of claim 18, further comprising placing a buffer atop the metal barrier.

* * * * *